(12) United States Patent
De Kok et al.

(10) Patent No.: US 9,076,970 B2
(45) Date of Patent: Jul. 7, 2015

(54) FOIL SHAPED ELECTRO-OPTICAL PRODUCT, SEMI-FINISHED PRODUCT AND METHOD AND APPARATUS FOR MANUFACTURING THE SAME

(75) Inventors: Margaretha Maria De Kok, Eindhoven (NL); Joanne Sarah Wilson, Dordrecht (NL); Leonardus Maria Toonen, Veldhoven (NL); Jasper Joost Michels, 's-Hertogenbosch (NL)

(73) Assignee: Nederlandse Organisatie voor toegepast-natuurwetenschappelijk onderzoek TNO, Delft (NL)

(*) Notice: Subject to any disclaimer, the term of this patent is extended or adjusted under 35 U.S.C. 154(b) by 277 days.

(21) Appl. No.: 13/521,854

(22) PCT Filed: Jan. 14, 2011

(86) PCT No.: PCT/NL2011/050021
§ 371 (c)(1),
(2), (4) Date: Oct. 29, 2012

(87) PCT Pub. No.: WO2011/087361
PCT Pub. Date: Jul. 21, 2011

(65) Prior Publication Data
US 2013/0140528 A1    Jun. 6, 2013

(30) Foreign Application Priority Data
Jan. 15, 2010  (EP) .................................. 10150893

(51) Int. Cl.
*H01L 35/24* (2006.01)
*H01L 51/00* (2006.01)
*H01L 51/52* (2006.01)

(52) U.S. Cl.
CPC ........ *H01L 51/0014* (2013.01); *H01L 51/0097* (2013.01); *H01L 51/52* (2013.01); *H01L 2251/5338* (2013.01); *Y02E 10/549* (2013.01)

(58) Field of Classification Search
CPC .................................................... H01L 51/0014
USPC ............................................ 257/40, E51.001
See application file for complete search history.

(56) References Cited

U.S. PATENT DOCUMENTS 6,274,978 B1   8/2001   Roach et al.
6,538,375 B1   3/2003   Duggal et al.
(Continued)

FOREIGN PATENT DOCUMENTS

JP    05-127154    5/1993
JP    8248276      9/1996
(Continued)

OTHER PUBLICATIONS

Machine Translation of JP 2006-106079.*
International Search Report for PCT/NL2011/050021, mailed Aug. 31, 2011.

*Primary Examiner* — Anthony Ho
(74) *Attorney, Agent, or Firm* — Patterson Intellectual Property Law, P.C.; James R. Cartiglia; Timothy L. Capria

(57) ABSTRACT

A curved foil-shaped electro-optical product (1) is provided having at least a first region with a basis substrate layer (10) of a shrunken organic substance, having a convex side and a concave side and comprising at the convex side (12) of the basis substrate layer at least a further layer (20), the electro-optical product further comprising at least a second region with an electro-optical structure (20).

16 Claims, 14 Drawing Sheets

(56) References Cited

U.S. PATENT DOCUMENTS

| | | |
|---|---|---|
| 7,368,307 B2 | 5/2008 | Cok |
| 7,561,772 B2 | 7/2009 | Shtein et al. |
| 2001/0049308 A1 | 12/2001 | Sams et al. |
| 2002/0196401 A1 | 12/2002 | Grace et al. |
| 2004/0212301 A1 | 10/2004 | Duggal et al. |
| 2005/0136210 A1 | 6/2005 | Boettcher |
| 2005/0242341 A1 | 11/2005 | Knudson et al. |
| 2006/0169989 A1 | 8/2006 | Bhattacharya et al. |
| 2006/0273304 A1 | 12/2006 | Cok |
| 2007/0159072 A1 | 7/2007 | Oh |
| 2008/0038459 A1 | 2/2008 | Lee et al. |

FOREIGN PATENT DOCUMENTS

| | | |
|---|---|---|
| JP | 10054927 | 2/1998 |
| JP | 2006-507528 | 2/2006 |
| JP | 2006-106079 | 4/2006 |
| WO | 9948124 | 9/1999 |
| WO | 0067117 | 11/2000 |
| WO | 0249853 | 6/2002 |
| WO | WO2004/086530 | 10/2004 |
| WO | 2005048831 | 6/2005 |
| WO | WO2006/097733 | 9/2006 |
| WO | 2009089105 | 7/2009 |

\* cited by examiner

FOIL SHAPED ELECTRO-OPTICAL PRODUCT, SEMI-FINISHED PRODUCT AND METHOD AND APPARATUS FOR MANUFACTURING THE SAME

BACKGROUND OF THE INVENTION

1. Field of the Invention

The present invention relates to a foil shaped electro-optical product.

The present invention further relates to a semi-finished foil shaped electro-optical product.

The present invention further relates to a method of manufacturing these products.

The present invention further relates to an apparatus for manufacturing these products.

2. Related Art

An electro-optic device is a device that provides for an optical effect in response to an electric signal, or that generates an electric signal in response to an optical stimulus. Examples of the first are light emitting diodes, such as organic light emitting diodes and electro chromic devices. Examples of the second are photo voltaic cells and optical sensors.

Nowadays such electro-optical devices can be manufactured relatively cheap as a foil in a roll-to-roll process. The devices so obtained have a flat shape. However, for electro-optical devices often a curved surface is desired, for example to obtain a particular light distribution.

US 2007159072 for example describes a tube-shaped OLED as well as a method for manufacturing the tube-shaped OLED. The method described therein comprises the steps of preparing a template having a first pore therein;
forming in the first pore a first tube-shaped electrode having a second pore whose diameter is smaller than that of the first pore;
forming in the second pore a tube-shaped light emitting member having a third pore whose diameter is smaller than that of the second pore; and forming a second electrode in the third pore.

It is a disadvantage of this method that it cannot be implemented as a roll-to-roll process.

Accordingly there is a need for a method that enables manufacturing an electro-optical device in shapes deviating from a flat shape using roll to roll technologies. There is further a need for an electro-optical device that can be manufactured according to such a method.

SUMMARY OF THE INVENTION

According to a first aspect of the present invention there is provided a method of manufacturing a curved foil shaped electro-optical product comprising the steps of providing a basis substrate layer of a shrinkable or expandable organic substance in at least a first region,
providing at least a further layer in said at least a first region to form a stack with said basis substrate layer,
providing an electro-optical structure,
applying a treatment that causes the organic substance to shrink, therewith causing the stack to curve inwards at a side provided with the shrinkable organic substance, or
applying a treatment that causes the organic substance to expand, therewith causing the stack to curve outwards at a side provided with the shrinkable organic substance.

Due to the presence of the shrinkable organic substance it is achieved that the foil-shaped electro-optical product autonomously assumes a desired shape without needing an external support structure. The various layers, the electro-optical structure may be applied at a temporary carrier substrate. The carrier substrate may for example be formed of a rigid material, such as a glass plate. Alternatively the carrier substrate may be of a flexible material, e.g. such as a polymer or a metal foil. After completion of the method or during execution of the method, the carrier substrate may be removed from the electro-optical product to be manufactured, e.g. by dissolving or etching away the temporary carrier substrate or by releasing the temporary carrier substrate from the product to be made, e.g. using a release liner.

Several options are possible to achieve the desired shrinkage or expansion. In an embodiment of the method according to the first aspect of the present invention the shrinkable organic substance is a heatshrink material and the treatment of the organic substance is a heat treatment. A heatshrink material is a polymeric substance of which the chains have been stretched in a chosen direction and frozen into a glassy network. Upon heating the chain mobility increases and the material softens, which allows chain relaxation to take place, whereby the material exhibits considerable shrinkage along the axis of stretching. Examples of heat shrink polymers include irradiated low density polyethylene (LDPE), polyolefin, poly-ethylene terephthalate (PET), and poly-vinyl chloride (PVC) and fluoropolymers such as poly-tetrafluoroethylene (PTFE), poly-vinylidene di-fluoride (PVDF), polyfluoroethylenepropylene (FEP), and poly(perfluoroalkoxy) (PFA). The extent to which the heatshrink material shrinks during heating depends on the extent to which it was stretched in its frozen phase. This dependency can be used in a manufacturing process to control the amount of curvature of the manufactured products. Heat shrink polymers may be selected for chemical resistance, zero or very low moisture absorption, electrical insulation, abrasion or tear resistance, cushioning, and anti-stick properties.

It is noted that WO200609733 discloses a method for the manufacture of an electronic or opto-electronic device. The method comprising the steps of:

(i) forming a polymeric substrate layer;
(ii) stretching the substrate layer in at least one direction;
(iii) heat-setting under dimensional restraint at a tension in the range of about 19 to about 15 kg/m of film width, at a temperature above the glass transition temperature of the polymer of the substrate layer but below the melting temperature thereof;
(iv) heat-stabilizing the film at a temperature above the glass transition temperature of the polymer of the substrate layer but below the melting temperature thereof;
(v) applying a planarizing coating composition such that the surface of said coated substrate exhibits an Ra value of less than 0.6 nm, and/or an Rq value of less than 0.8 nm;
(vi) applying an inorganic barrier layer of thickness from 2 to 1000 nm by high-energy vapor deposition; and
(vii) providing the composite film comprising said polymeric substrate layer, said planarising coating layer and said inorganic barrier layer as a substrate in said electronic or opto-electronic device.

Accordingly, in the known method, the polymeric substrate layer is heat-stabilized before the remaining layers and before it is used as a substrate for the opto-electronic device. The known method therewith avoids that a curved product is obtained.

In another embodiment of the method according to the first aspect of the present invention the shrinkable or expandable organic substance is a precursor for a polymer and the treatment of the organic substance comprises the step of polymerizing or converting the organic substance. Depending on the desired degree of curvature, the precursor may comprise a UV- or thermal curing/cross-linking solvent-free formulations of one of the following categories.
i) high polymerization shrinkage,
ii) medium polymerization shrinkage,
iii) low-to-medium polymerization shrinkage, and
iv) zero-to-low polymerization shrinkage or even polymerization expansion.

Examples of category i) are systems that cure by radical addition polymerization, such as acrylates, methacrylates, and thiol-ene systems, and systems that react via addition reactions that do not lead to ring opening, such as isocyanate-amine systems and isocyanate-hydroxyl systems Examples of category ii) are systems that cure by ring opening polymerization concerning small ring systems, such as epoxides (cationic cure), epoxy-amine systems, anhydride-amine systems, and anhydride-alcohol systems Examples of category iii) are systems that cure by ring opening polymerization concerning larger ring systems than in the case of epoxide-based systems, such as oxetanes (cationic cure) and oxetane-amine systems Examples of category iv) are systems that cure by double ring opening polymerization, leading to very low to zero shrinkage or even polymerization expansion, such as spiro-orthoesters and spiro-orthocarbonates.

The above mentioned cross-linking functionalities may be based on functional building blocks such as oligo(ethylene oxide), poly(ethylene oxide), alkyl blocks, aliphatic poly- or oligoesters, aromatic poly- or oligoesters, poly- or oligobutadienes, aliphatic poly- or oligoethers, aromatic poly- or oligoethers, aliphatic poly- or oligocarbonates, aromatic poly- or oligocarbonates, aliphatic poly- or oligouethanes, aromatic poly- or oligourethanes, aliphatic urethanes, aromatic urethanes, polyphenols, alkoxylated phenols, aliphatic poly- or oligoepoxides, aromatic poly- or oligoepoxides (e.g. based on biphenol-A or ethoxylated bisphenol-A), neopentyl glycol, pentaerythritol, dipentaerythritol, trimethylol propane, ethoxylated trimethylol propane, caprolactone, poly- or oligosiloxanes, aliphatic poly- or oligopeptides, aromatic poly- or oligopeptides, aliphatic poly- or oligoamines, aromatic poly- or oligoamines, poly- or oligostyrene, or any combination thereof. Reactive diluents may be chosen from any of the above mentioned cross-link categories and may be based on any of the mentioned functional building blocks.

The overall polymerization shrinkage or expansion of a curing formulation may be fine-tuned by making any number of combinations from each of the four mentioned cross-link categories. For example systems that expand during polymerization may be combined with systems that shrink during polymerization to achieve a composition that is free of shrink.

Another way of tuning the overall polymerization shrinkage is by choosing any number of cross-linking functionality for each component in the formulation. Mono-, di-, tri- or higher functional materials may be used. The overall polymerization shrinkage or expansion may be further tuned by using any loading percentage of an inert filler in particulate form, such as polymers, ceramics, any form of carbon, silicates, metals, (organometallic) metal complexes, and metal salts. The particles may or may not be passified with cross-linking groups which react with the matrix material, thereby enhancing the adhesion to the matrix material.

According to a second aspect of the present invention a curved foil-shaped electro-optical product with an electro-optical structure is provided having at least a basis substrate layer with a convex side and a concave side in a first curved region, said basis substrate layer being of a shrunken organic substance and having at least a further layer at its convex side, or said basis substrate layer being of an expanded organic substance and having at least a further layer at its concave side, the layers being mechanically coupled to each other. Due to the presence of the shrunken or expanded organic substance it is achieved that the foil-shaped electro-optical product autonomously assumes a desired shape without needing an external support structure.

The curved foil shaped electro-optical product according to the second aspect is obtainable from a semi-finished product according to a third aspect.

According to the third aspect of the invention a semifinished foil shaped product comprising an electro-optical structure is provided comprising at least a first region with a basis substrate layer of a shrinkable or expandable organic substance and at least a further layer, the layers being mechanically coupled to each other.

An embodiment of the semifinished foil shaped product according to the third aspect of the invention, comprises a plurality of zones, each zone having one or more electro-optical structures that are encapsulated by a first and a second barrier layer. This makes it possible to separate the zones according to separation lines between the zones from the semifinished product.

The semi-finished product according to the third aspect is obtainable by the steps of
providing a basis substrate layer of a shrinkable or expandable organic substance in at least a first region,
providing at least a further layer in said at least a first region to form a stack with said basis substrate layer,
providing an electro-optical structure.

Subsequently the curved foil shaped electro-optical product according to the second aspect is obtainable from the semi-finished product by the additional step of
applying a treatment that causes the organic substance to shrink, therewith causing the stack to curve inwards at a side provided with the shrinkable organic substance, or
applying a treatment that causes the organic substance to expand, therewith causing the stack to curve outwards at a side provided with the expandable organic substance.

The curved foil shaped electro-optical product according to the second aspect is obtainable directly by combining the steps necessary for obtaining the semi-finished product and the steps for obtaining the curved foil shaped electro-optical product from the semifinished product.

The electro-optical structure typically comprises a plurality of layers, e.g. a first and a second electrode layer and one or more electro-optical layers embedded between the first and the second electrode layer. Alternatively the electro-optical structure may be formed as a single layer, e.g. comprising a first and a second electrode formed as two interlocking comb-like structures between which an electro-optical material is applied. Depending on the application furthermore protection layers and other auxiliary layers, such as electrode shunting layers may be available.

In an embodiment the at least a first region is arranged between mutually separate second regions each comprising an electro-optical structure. This method has the advantage that the curvature of the product is induced in regions outside the regions that comprise the electro-optical structure. This makes it possible to achieve a relatively strong curvature without damaging the electro-optical structure(s).

In an embodiment the mutually separate regions are electrically coupled via stretchable electrical connection lines.

In an embodiment the stretchable electrical connection lines are meandering electrical connection lines. The meandering electrical connection lines may be significantly stretched in the at least a first region between the isolated second regions, even if the material as such used for the electrical connections has a relatively high elasticity modulus. This makes it possible to select the material for the electrical connections from a large class of materials, including materials having a good electrical conductivity but a limited stretchability as such, e.g. copper or silver.

In an embodiment of the electro-optical product according to the second aspect of the invention the electro-optic structure is applied at the convex side of the shrunken organic substance. In this embodiment the electro-optical structure is compressed rather than stretched. This makes it possible to allow a stronger curvature of the electro-optic product than in the case where the electro-optic structure is applied at the concave side, as stretching of the electro-optic structure is avoided.

The electro-optical structure may comprise the further layer. In an embodiment the further layer is a further substrate layer that is arranged opposite the basis substrate layer and that is subject to a different amount of shrink or expansion than the basis substrate layer. The further substrate layer provides for a more regular curvature of the product. However, in another embodiment the electro-optical structure may have a sufficient stiffness to perform the function of the further substrate layer.

In a particular embodiment of the latter embodiment the electro-optical structure is arranged in a second region that at least partly coincides with the at least a first region, and the electro-optical structure is arranged between the basis substrate layer and the further substrate layer. This has the advantage that the electro-optical structure is bilaterally protected in as far as the at least a first and the second region coincide, and that the electro-optical structure is arranged in a zone where the deformation is relatively low.

The semifinished product may be provided as a foil that can be further processed by global or local application of heat or photon radiation into a curved foil shaped product by application of heat.

In an embodiment the shrinkable organic substance, is a reversibly shrinkable organic substance. In this way it is possible to modify the shape of the finished product depending on the prevailing circumstances.

In accordance therewith a foil-shaped electro-optical product with an electro-optical structure is provided having at least a basis substrate layer of a reversibly shrinkable material, and having at least a further layer that is mechanically coupled to the basis substrate layer.

In particular embodiment the reversible shrinkage is determined by a temperature of the substance. This embodiment is for example applicable in an electro-optic product of the photo-voltaic type. Dependent on the position of the sun in the sky also the temperature of the environment changes. A reversible shrinking of the basis substrate layer dependent on the temperature can be used to curve the electro-optic product for receiving an optimum amount of solar radiation or to protect the electro-optic product from overheating.

In embodiment the temperature of the reversible shrinkable optical substance is controlled by resistive elements. Therewith the shrinkage of the basis substrate layer, and therewith the curvature of the product may be controlled explicitly in this way. In a LED or other photon radiation source, this can be used to control the distribution of photon radiation.

According to a fourth aspect of the invention an apparatus is provided for manufacturing a foil shaped electro-optical product the apparatus comprising a first facility for providing at least a first region with a basis substrate layer of a shrinkable organic substance,
a second facility for providing at least an electro-optical structure,
a third facility for applying a treatment that causes the organic substance to shrink or to expand, therewith causing the at least a first region to curve inwards or outwards at a side provided with the shrinkable organic substance.

According to a fifth aspect of the present invention a foil-shaped electro-optical product is provided having a substrate layer of an organic material and having an electro-optical structure that is supported by the substrate layer, the substrate layer having at least a first portion that overlaps the electro-optical structure and a second portion that does not overlap the electro-optical structure, wherein the at least one portion that does not overlap the at least one electro-optical structure is of a relatively stretchable material and the at least one portion that overlaps the electro-optical structures is of a relatively non-stretchable material. A stretchable material is considered a material that can be stretched elastically or inelastically with a relatively low force as compared to the relatively non-stretchable material.

The relatively stretchable material will usually be flexible too. The relatively non-stretchable material may be either flexible or non-flexible depending on the application.

A foil-shaped electro-optical product may have the combined features according to the second and the fifth aspect of the invention. For example a device may have a basis substrate layer according to the second aspect of the invention and a further substrate layer according to the fifth aspect of the invention.

According to a sixth aspect of the invention a method is provided of manufacturing a foil-shaped electro-optical product comprising the steps of providing an electro-optical structure,
providing a substrate layer of an organic material to support the electro-optical structure, and
wherein the step of providing the substrate layer comprises providing at least a first portion of said substrate layer from a relatively non-stretchable material said at least a first portion overlapping the electro-optical structure and providing at least a second portion of said substrate layer from a relatively stretchable material said at least a first portion not overlapping the electro-optical structure.

In an embodiment the substrate layer is applied before the electro-optical structure. In another embodiment the substrate layer is applied after the electro-optical structure.

A substrate layer with said at least a first and at least a second portion may be provided as a semi-finished product.

The substrate layer may be manufactured by applying mutually different precursors for the materials in said at least a first and at least a second portion and/or by applying a mutually different treatment to the at least a first and at least a second portion.

In case mutually different precursors are used for the at least a first and at least a second portion these precursors may be allowed to partially diffuse into each other at an interface. An area of the interface may be increased by applying the mutually different precursors in an overlapping fashion. In that case the mutually different precursors may be printed with a mutually opposite gradient in height, so that the total height in the region of overlap is constant.

The various layers, the electro-optical structure and possible other parts of the electro-optic product to be manufactured may be applied at a temporary carrier substrate. The carrier substrate may for example be formed of a rigid material, such as a glass plate. Alternatively the carrier substrate may be of a flexible material, e.g. such as a polymer or a metal foil. After completion of the method or during execution of the method, the carrier substrate may be removed from the electro-optical product to be manufactured, e.g. by dissolving or etching away the temporary carrier substrate or by releasing the temporary carrier substrate from the product to be made, e.g. using a release liner.

According to a seventh aspect of the invention an apparatus is provided for manufacturing a foil-shaped electro-optical product comprising a facility for providing an electro-optical structure,
a facility for providing a substrate layer of an organic material to support the electro-optical structure, and
wherein the facility for providing the substrate layer is arranged for providing at least a first portion of said substrate layer from a relatively non-stretchable material, said at least a first portion overlapping the electro-optical structure and providing at least a second portion of said substrate layer from a relatively stretchable material said at least a first portion not overlapping the electro-optical structure.

The facility for providing the electro-optical structure may comprise conventional means used this purpose. The facility for providing the substrate layer may comprise a printing arrangement for e.g. an ink-jet printer, a rotary screen printer or a roto-gravure printer. The facility for providing the substrate layer may further have facilities for curing the substrate layer, e.g. by photon radiation or by heat.

BRIEF DESCRIPTION OF THE DRAWINGS

These and other aspects are described in more detail with reference to the drawing. Therein:

FIG. 1C illustrates a first step of said method,
FIG. 1D illustrates a second step of said method,
FIG. 1E illustrates a third step of said method,
FIG. 1F illustrates a semi-finished product according to the third aspect of the invention resulting from a third step of said method.

DETAILED DESCRIPTION OF EMBODIMENTS

Figure 1:
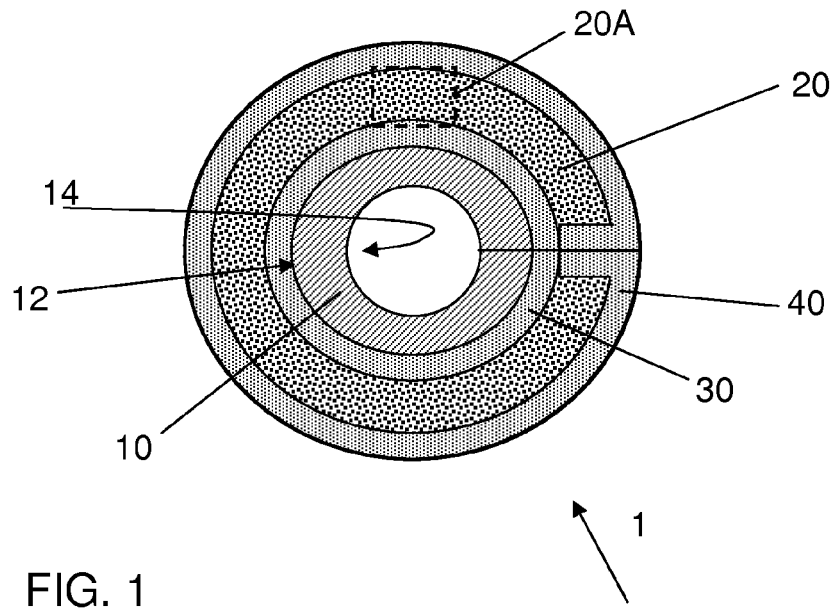
FIG. 1 shows an embodiment of a curved foil-shaped electro-optical product according to the second aspect of the invention.
Figure 1A:
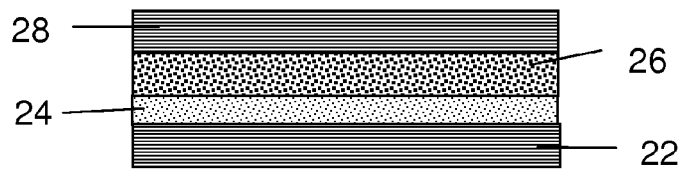
FIG. 1A shows in more detail a cross-section of the product of FIG. 1 according to 20A in FIG. 1.
Figure 1B:
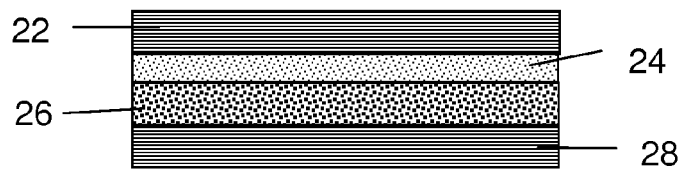
FIG. 1B shows a cross-section in an alternative embodiment.

FIG. 1 shows a curved foil-shaped electro-optical product 1 that has at least a first region with a basis substrate layer 10 of a shrunken organic substance. The basis substrate layer 10 has a convex side 12 and a concave side 14 and the product 1 comprises at the convex side 12 of the basis substrate layer 10 at least a further layer. The electro-optical product 1 further comprises at least a second region with an electro-optical structure 20. The electro-optical structure 20 is for example a stack of layers that converts an electrical current into light. The stack may comprise The electro-optical structure, of which a portion 20A is shown in FIG. 1A typically comprises a stack comprising an anode 22 of a conducting material, a hole transporting layer 24, a light emitting layer 26, and a cathode 28.

In this case, the anode 22 is preferably formed of a highly reflective metals such as aluminum or silver, so that light radiated inward is reflected outward, but other electrically conductive materials, such as other metal layers, conductive metal oxide layers such as ITO (Indium Tin Oxide), IZO (Indium Zinc Oxide), ATO (Antimony Tin Oxide), or Tin Oxide can be used. Other metal oxides can work, including but not limited to Nickel-Tungsten-Oxide, Indium doped Zinc Oxide, Magnesium-Indium-Oxide and conductive polymer layers such as polyaniline, polythiophene, polypyrrole or doped polymers are also suitable. The reference numeral 24 indicates a hole transport layer, Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4''-tris(N,N-diphenyl-amino)-triphenylamine (TDATA); 4,4',4''-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); a-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4- methylphenyl)-(1,1'-biphenyl)-4,4'-diamine (TTB); N,N'-bis (naphthalen-1-yl)-N,N'-bis-(phenyl)benzidine (a-NPB); and porphyrinic compounds, such as copper phthalocyanine. Commonly used hole transporting polymers include, but are not limited to, poly(9,9-dioctyl-fluorene-co-N-(4-butylphenyl)diphenylamine), and the like, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

A light-emitting layer 26 or photoactive layer may typically comprise any organic electroluminescent ("EL") material, including, but not limited to, small molecule organic fluorescent compounds, fluorescent and phosphorescent metal complexes, conjugated polymers, and combinations or mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof.

Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and may further include combinations or mixtures thereof.

The choice of a particular material may depend on the specific application, potentials used during operation, or other factors. The EL layer 26 containing the electroluminescent organic material can be applied using any number of techniques including vapor deposition, solution processing techniques or thermal transfer. In another embodiment, an EL polymer precursor can be applied and then converted to the polymer, typically by heat or other source of external energy (e.g., visible light or UV radiation).

The cathode layer 28 is an electrode that is particularly efficient for injecting electrons or negative charge carriers. The cathode layer 28 can be any metal or nonmetal having a lower work function than the first electrical contact layer (in this case, the anode layer). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, ytterbium, and combinations thereof, may also be used. Specific non-limiting examples of materials for the cathode layer include, but are not limited to, barium, lithium, cerium, cesium, europium, rubidium, ytterbium, magnesium, samarium, and alloys and combinations thereof.

The cathode layer 28 is usually formed by a chemical or physical vapor deposition process. In a typical embodiment the cathode comprises a first layer of Ba having a thickness of about 5 nm and facing towards the luminescent layer 26 and a second layer of aluminum having a thickness in the range of 100-400 nm facing away from the luminescent layer.

In the embodiment of the electro-optical device 1 shown in FIG. 1, the electro-optical structure 20 is protected by a first and a second barrier structure 30, 40 that encapsulate the electro-optical structure 20.

In this case the electro-optical structure 20 is applied at the convex side 12 of the basis substrate layer 10. In another embodiment of the electro-optical product the electro-optic structure 20' is applied at the concave side 14 of the shrunken organic substance 10.

A barrier structure typically comprises a stack of sub-layers. In a first embodiment the barrier structure is a stack comprising an organic layer sandwiched between a first and a second inorganic layer. The stack may comprise further organic and inorganic layers that alternate each other. The organic layers may comprise a moisture getter.

The organic layers may be provided from a cross-linked (thermoset) material, an elastomer, a linear polymer, or a branched or hyper-branched polymer system or any combination of the aforementioned, optionally filled with inorganic particles of a size small enough to still guarantee light transmission. The material is processed either from solution or as a 100% solids material. Curing or drying may exemplary occur by irradiation of the wet material, pure, or suitably formulated with a photo- or heat-sensitive radical or super-acid initiator, with UV-light, visible light, infrared light or heat, E-beam, g-rays or any combination of the aforementioned. The material of the organic layer preferably has a low specific water vapour transmission rate and a high hydrophobicity. Examples of suitable cross-linking (thermoset) systems are any single one or any combination of aliphatic or aromatic epoxy acrylates, urethane acrylates, polyester acrylates, polyether acrylates, saturated hydrocarbon acrylates, epoxides, epoxide-amine systems, epoxide-carboxylic acid combinations, oxetanes, vinyl ethers, vinyl derivatives, and thiol-ene systems. Suitable examples of elastomeric materials are polysiloxanes. Examples of suitable branched or linear polymeric systems are any single one or any copolymer or physical combination of polyacrylates, polyesters, polyethers, polypropylenes, polyethylenes, polybutadienes, polynorbornene, cyclic olefin copolymers, polyvinylidenefluoride, polyvinylidenechloride, polyvinylchloride, polytetrafluoroethylene, polychlorotrifluoroethylene, polyhexafluoropropylene. The organic layers may have a thickness between 0.1-100 µm, preferably between 5 and 50 µm.

The inorganic layer(s) may be any ceramic including but not limited to metal oxide, such as indium oxide (In2O3), tin oxide (SnO2), indium tin oxide (ITO), a metal nitride, such as aluminium nitride (AlN), silicon nitride (SiN), a carbide, such as silicon carbide, a metal oxynitride, e.g. siliconoxynitride, or any other combination such as metal oxy carbides, metal carbonitrides, metal oxycarbonitrides. In case that the electronic device has an optical function it is relevant that at least one side (foundation or cover) is substantially transparent ceramic. Suitable materials therefore are for example silicon oxide (SiO2), aluminum oxide (Al2O3), titanium oxide (TiO2), indium oxide (In2O3), tin oxide (SnO2), indium tin oxide (ITO, In2O3+SnO2), (SiC), silicon oxynitride (SiON) and combinations thereof.

The inorganic layers have a water vapour transmission rate of at most $10^{-4}$ g·m$^{-2}$·day$^{-1}$.

The inorganic layer(s) are in practice substantially thinner than the organic layers. The inorganic layers should have a thickness in the range of 10 to 1000 nm, preferably in the range of 100 to 300 nm.

The total thickness of the first and the second barrier layer is preferably at least 50 µm. At a thickness substantially smaller than 50 µm, e.g. 20 µm, the resulting encapsulated electronic device tends to damage too quickly. Preferably the total thickness is less than 500 µm. If the thickness is substantially more, e.g. 1 mm, the flexibility of the product is impaired.

Depending on the size of the product and the required amount of curvature the substrate may have a thickness in the range of 1 and 5000 □m. The radius of curvature may vary for example in a range between 1 and 1000 mm.

In the embodiment shown the basis substrate layer 10 is of a shrunken organic substance. The basis substrate layer 10 defines a first region. The electro-optical structure 20 extends over a second region that coincides with the first region.

In an alternative embodiment the layers 22, 24, 26 and 28 are applied in a reverse order as shown in FIG. 1B FIG. 1C to 1F schematically illustrate a method of manufacturing the product shown in FIG. 1.

Figure 1C:
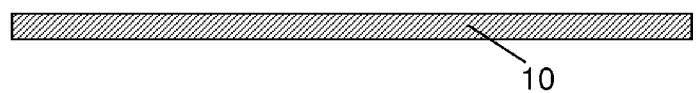
FIG. 1C to 1F illustrate an embodiment of a method according to the first aspect of the invention, therein

In the first step shown in FIG. 1C a polymer foil 10 is provided of a heat-shrink material.

Figure 1D:
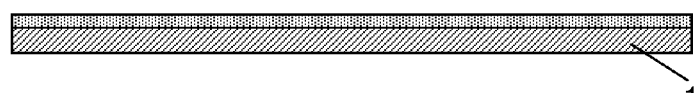

In a second step shown in FIG. 1D the foil 10 is provided with a barrier structure 12, e.g. stack of silicon nitride, and silicon oxide layers that alternate each other.

Figure 1E:
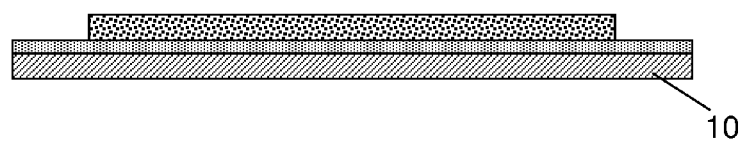

In a third step shown in FIG. 1E an electro-optical structure 20 is applied at the barrier structure 12. The electro-optical structure 20 may comprise a stack of layers comprising an electro-luminiscent material, a cathode, an anode, a hole injection layer etc.

Figure 1F:
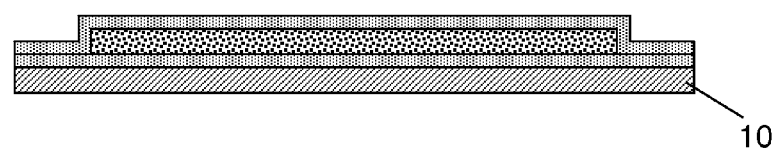

In a fourth step shown in FIG. 1F a further barrier structure 40 is applied, that together with the barrier structure 12 encapsulates the electro-optical structure 20.

In a fifth step the foil 10 is subjected to a heat treatment. This causes shrinkage of the foil 10 and therewith an inwards curving of the product, resulting in the product shown in FIG. 1. To heat the foil 10 it may be radiated with radiation of a wavelength that is well absorbed by the foil. To keep the electro-optic structure 20 at a relatively low temperature the radiation may be applied pulse wise.

Figure 2:
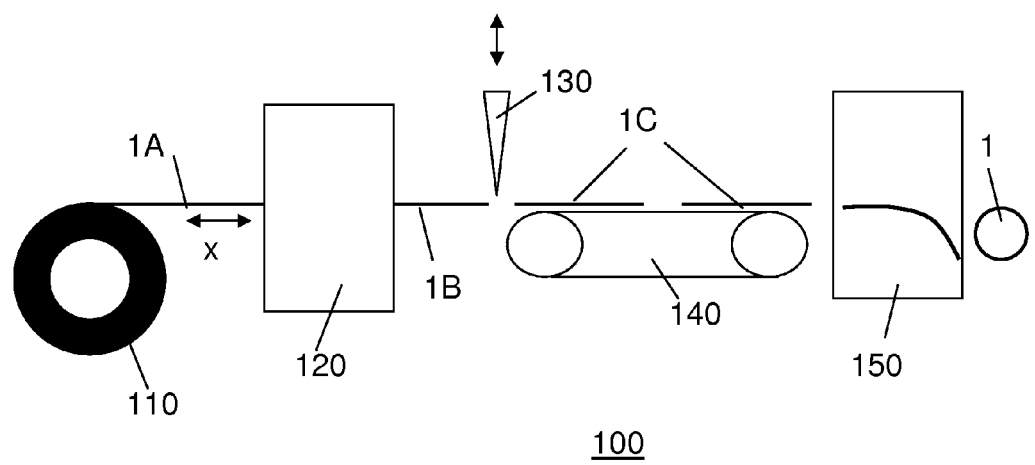
FIG. 2 shows an embodiment of an apparatus according to a fourth aspect of the invention, FIG. 3 another embodiment of a curved foil-shaped electro-optical product according to the second aspect of the invention.

FIG. 2 schematically shows an apparatus 100 for manufacturing a foil shaped electro-optical product 1 according to the invention.

The apparatus comprises a first facility 110 for providing at least a first region with a basis substrate layer of a shrinkable organic substance. The first facility comprises a roll that comprises a continuous foil 1A of a shrinkable organic substance formed by a heat-shrink material. The heat-shrink material is a polymeric substance of which the chains have been stretched in a chosen direction, here in the direction indicated by x, and frozen into a glassy network. Alternatively the foil may be stretched in another direction, e.g. in a direction y transverse to the direction x and to the plane of the drawing.

The apparatus 100 comprises a second facility 120 for providing at least a second region with an electro-optical structure. The second facility 120 may apply for example a single second region that for example extends over the entire foil 1A, but may alternatively apply a plurality of mutually separate second regions on the foil 1A. Reference 1B denotes the foil of which one or more regions are provided with the electro-optical structure. In addition to an electro-optical structure, the second facility 120 may further apply additional layers or structures, such as barrier structures, electrical conductors, and a further substrate layer. A cutting device 130 separates the foil processed by second facility 120 into separate parts 1C. In case the electro-optical structure comprises materials that are sensitive for substances in the atmosphere, such as moisture and oxygen, and if it is desirable to prevent side leakage, measures may be provided as disclosed in US2007/196682

Alternatively, further processing of the parts 1C may take place in vacuum or in a protective atmosphere. The separated parts 1C are transported by a transport mechanism 140 to a third facility 150 for applying a treatment that causes the organic substance to shrink. In this case the third facility comprises a heater that causes the chain mobility of the shrinkable substance forming the basis substrate layer to increase and to soften the substance. This allows chain relaxation to take place, whereby the basis substrate layer exhibits shrinkage along the axis of stretching. This causes the at least a first region defined by the basis substrate layer or a heated portion thereof to curve inwards at a side provided with the shrinkable organic substance so that the curved foil-shaped electro-optical product 1 of FIG. 1 is formed.

Figure 3:
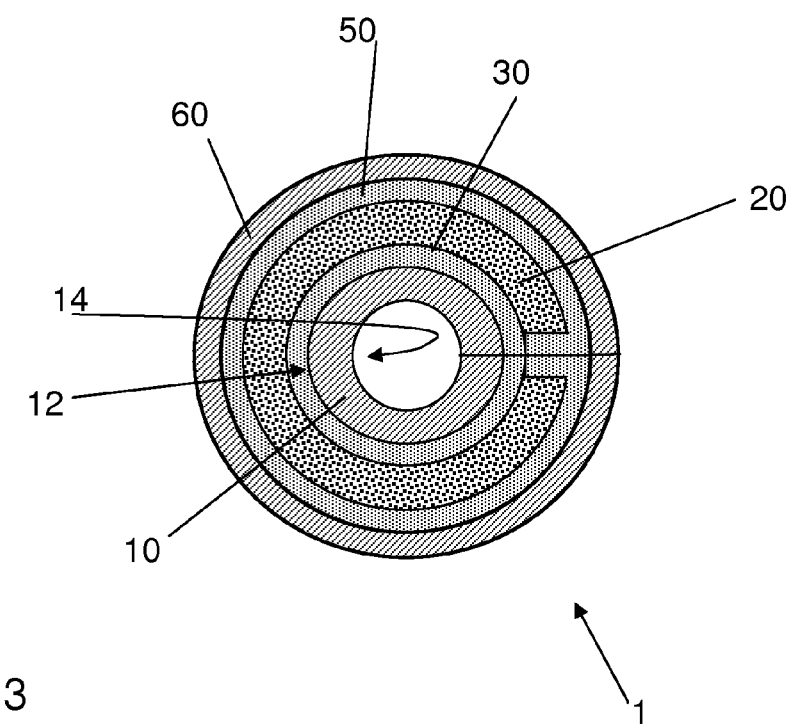

FIG. 3 shows an alternative embodiment of a curved foil-shaped electro-optical product according to the present invention that differs from the embodiment shown in FIG. 1 in that the device has a further substrate layer 60. The further substrate layer 60 is applied in the first region that is defined by the basis substrate layer 10 and opposite the basis substrate layer, so that the electro-optical structure 20 is arranged between the basis substrate layer 10 and the further substrate layer 60. The further substrate layer 60 is of a material that was subject to a less amount of shrink during the manufacturing than the material of the basis substrate layer 10. It is even possible that the further substrate layer is of a material that subject to an expansion during its polymerization, e.g. a material according to category IV mentioned above. In the embodiment shown the at least a second region with the electro-optical structure 20 at least partly coincides with the at least a first region, and the electro-optical structure is arranged between the basis substrate layer 10 and the further substrate layer 60. This has the advantage that the electro-optical structure is bilaterally protected in as far as the at least a first and the second region coincide, and that the electro-optical structure is arranged in a zone where the deformation is relatively low.

It is not necessary that the first region defined by the layer of the shrunken organic substance and the second region comprising the electro-optical structure overlap each other. In an embodiment shown in FIG. 4A and FIG. 4B the device 1 (formed as a tube with radius r and length l) comprises a plurality of mutually separate second regions 1b. First regions 1a are arranged between the separate second regions. The second regions 1b each comprise an electro-optical structure 20. The first regions 1a comprise a basis substrate layer of a shrunken organic substance. The second regions 1b comprising the electro-optical structures 20 are not shrunken.

Figure 4A:
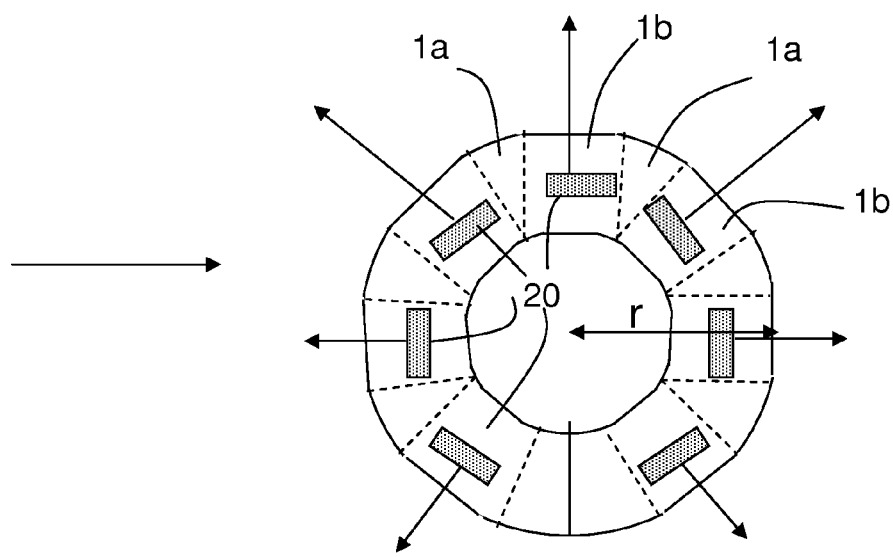
FIG. 4A shows a cross-section of again another embodiment of a curved foil-shaped electro-optical product according to the second aspect of the invention.
Figure 4B:
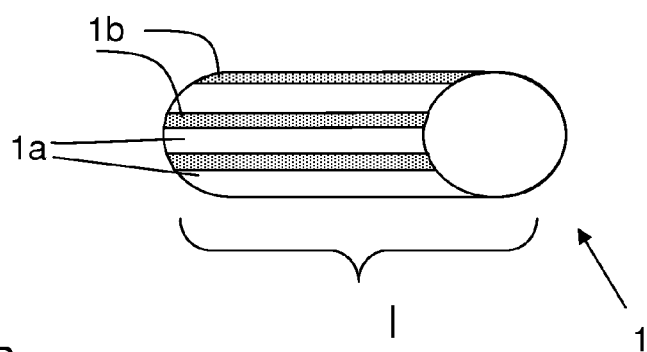
FIG. 4B shows a perspective view of said curved foil-shaped electro-optical product.
Figure 4C:
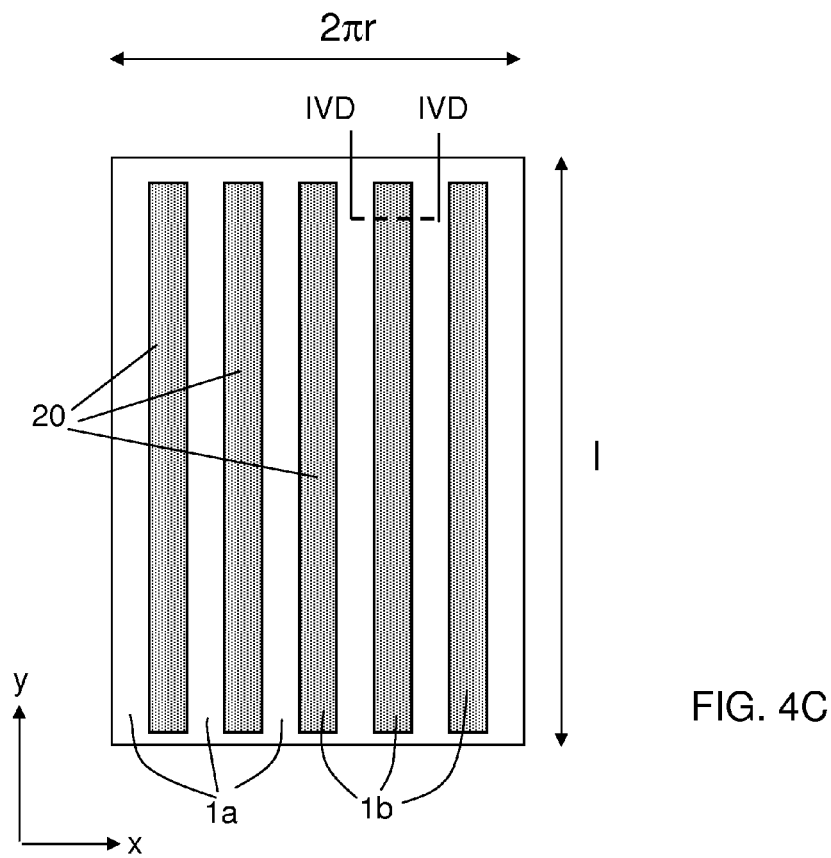
FIG. 4C shows a semi-finished product according to the third aspect of the invention that can be used to manufacture the product of FIGS. 4A and 4B.
Figure 4D:
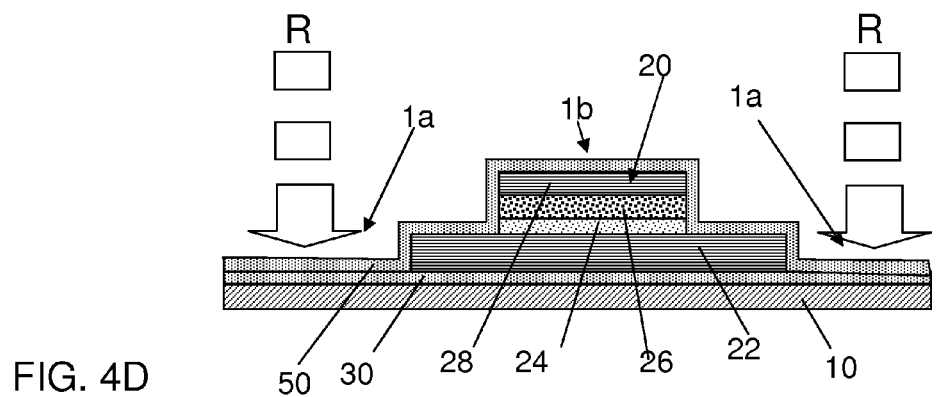
FIG. 4D shows a cross-section of the semi-finished product according to IVD-IVD in FIG. 4C.

The product as shown in FIGS. 4A and 4B may be obtained from a semi-finished product as shown in FIG. 4C. The semi-finished product of FIG. 4C comprises a plurality of elongate regions 1b each comprising an electro-optical structure 20 that are mutually separated by a region 1a. A cross-section according to IVD-IVD in FIG. 4C is shown in FIG. 4D. As can be seen in FIGS. 4D and 4C the semifinished product comprises a basis-substrate 10 of a shrinkable foil that extends in the x-y plane. The basis-substrate 10 is provided with a first barrier structure 30. The electro-optical structures each comprise various functional layers 22, 24, 26 and 28 as described before. A second barrier structure 50 extends over the full surface formed by the first barrier structure 30 and the electro-optical structures 20, so that the electro-optical structures 20 are encapsulated by the barrier structures 30, 50. By a local, pulsed radiation R the basis-substrate 10 is selectively heated in the first regions 1a so that in said regions 1a the basis-substrate starts to shrink and causes a curvature in the product, while the other regions 1b that are not exposed to the radiation remain flat.

Figure 5A:
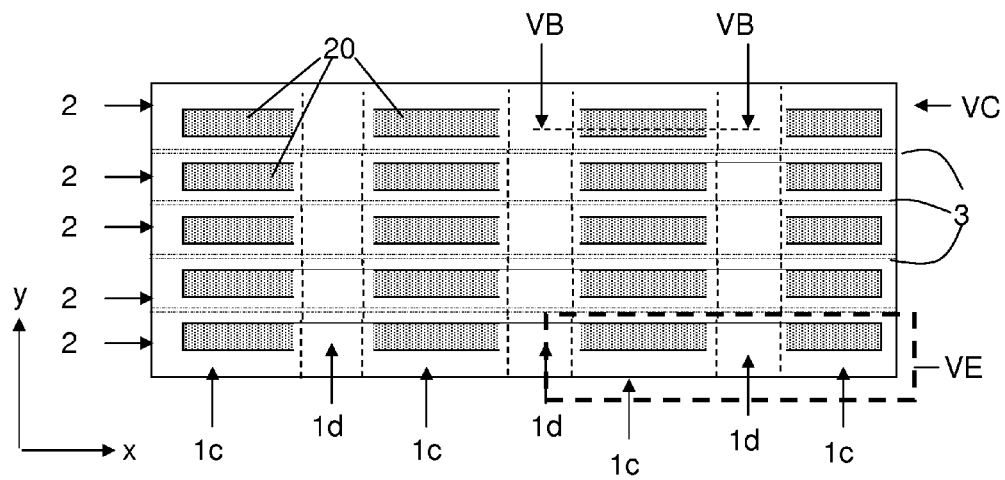
FIG. 5A shows a further semi-finished product according to the secondthird aspect of the invention
Figure 5B:
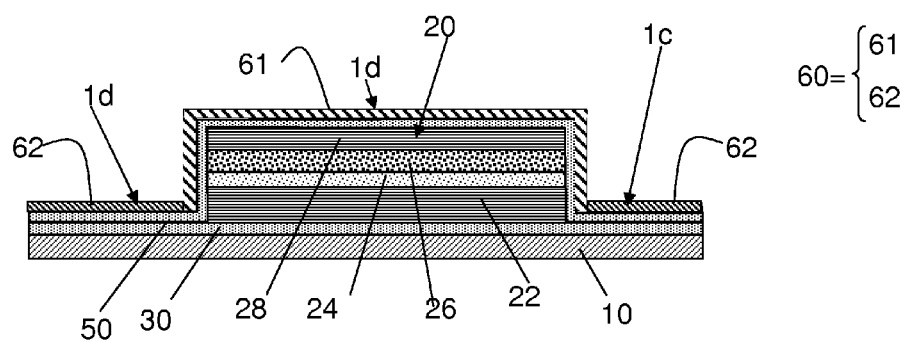
FIG. 5B shows a cross-section according to VB-VB in FIG. 5A.

FIG. 5A shows a further intermediate product having a cross-section according to VB-VB as shown in FIG. 5B. In this case the product has a continuous shrinkable layer of a shrinkfoil 10 that defines a first region. I.e. in this case the first region extend over the full area of the product. The product comprises a plurality of regions with an electro-optical structure 20 that is mechanically coupled to the basis substrate. In this case the semifinished foil shaped product shown in FIG. 5A comprises a plurality of zones 2. Each zone comprises one or more electro-optical structures 20 that are encapsulated by a first and a second barrier layer 30, 50. The zones 2 may be separated from the semi-finished product shown in FIG. 5A along cutting lines 3.

It can be seen in cross-section in FIG. 5B that the semifinished product has a further substrate layer 60 that has portions 61 that overlap the electro-optical structure in regions 1c and portions 62 in regions 1d that do not overlap the electro-optical structure. The portions 62 that do not overlap the electro-optical structure 20 are of a relatively stretchable material. The portions 61 that do overlap the electro-optical structures are of a relatively non-stretchable material. A stretchable material is considered a material that can be stretched elastically or inelastically with a relatively low force. I.e. when applying a force of a predetermined strength at the portions 61 and 62, the portions 62 are stretched more than the portions 61. However, both the portions 61 and 62 are relatively flexible.

Figure 5C:
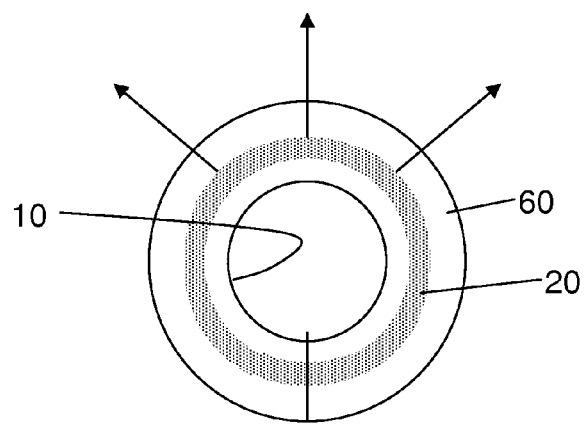
FIG. 5C shows a cross-section of an end-product obtained from the semi-finished product of FIG. 5A.
Figure 5D:
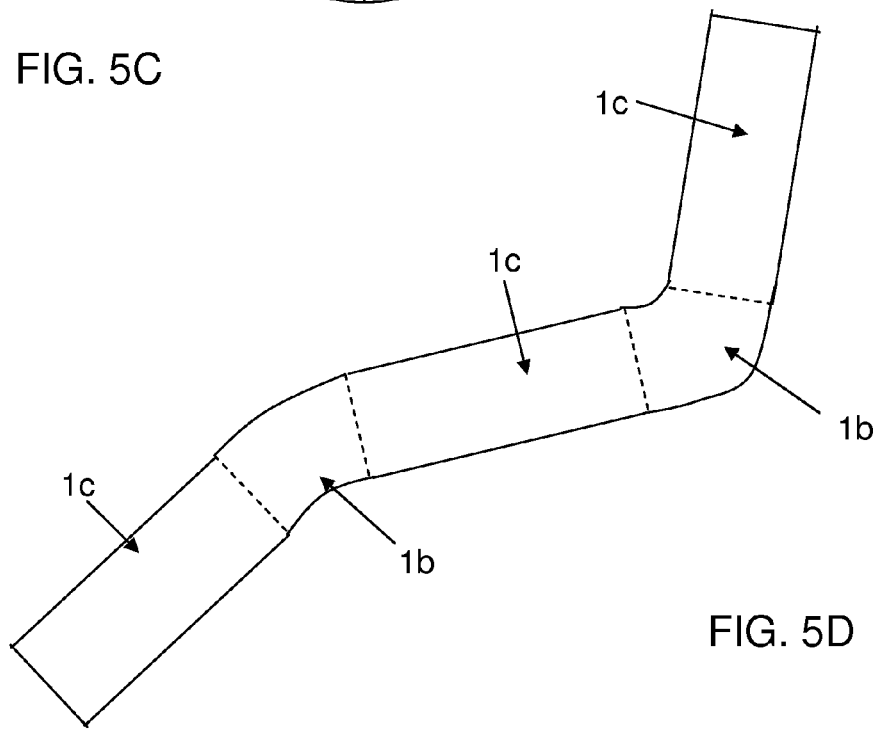
FIG. 5D shows a perspective view of said end-product.

FIG. 5C shows according to a view VC in FIG. 5A, a zone 2 that is separated from the semi-finished product of FIG. 5A. The zone is 2 is subjected to a heat-treatment so that the shrinkfoil 10 of the semi-finished product curls up in the direction y, and causes the semi-finished product to assume a tubular shape. FIG. 5D shows that the tubular shaped product can be further deformed in the regions 1d due to the relatively stretchable portions 62 of the further substrate layer 60. Therewith the regions 1c having an electro-optical structure 20 substantially maintain the shape of a straight tube.

In order to provide a reliable electric connection to the electrodes of the electro-optical structures, various options are possible. One option is to provide electrical connections using a stretchable electrically conductive polymer.

Another option is to provide the electric connections in the form of a meandering conductor. In this case the conductor does not need to be stretchable. It is sufficient if the material of the electric conductor is flexible.

Figure 5E:
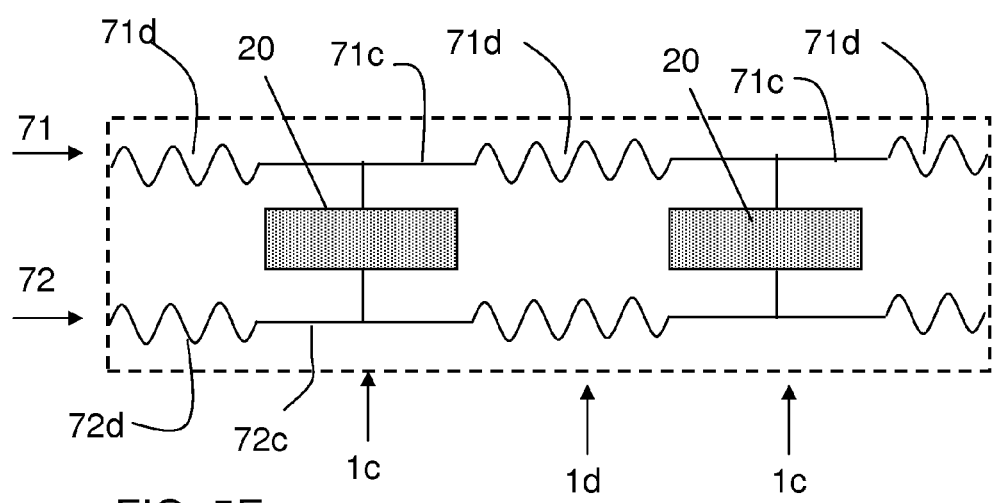
FIG. 5E shows a detail of said end-product.

FIG. 5E schematically shows an example of a portion VE of the semi-finished product provided with such electrical conductors. The conductors 71, 72 for electrically coupling the electro-optical structures 20 to an external power source comprise meandering conductor portions 71d, 72d in the regions 1d having the relatively stretchable portions 62 of the further substrate layer. In those regions 1c overlapping the electro-optical structures 20, where a relatively non-stretchable material is used for the further substrate layer 60, the electrical conductors 71, 72 have straight portions 71c, 72c. Alternatively, the electric conductors 71, 72 may be also formed here in a meandering shape, but this is not necessary, and a straight shape is advantageous in that it provides for the best electrical conduction for a predetermined cross-sectional area of the electric conductor.

In other embodiments the electric conductors may be formed by a metal wire embedded in rubber, e.g. a PDMS matrix. Alternatively a conductor of embedded metal or graphite nanoparticles or microparticles. Also a conductor may be formed by embedded nanoparticles.

As an example the relatively non-stretchable regions of the further substrate were formed from a composition comprising 26% isobornyl acrylate/9% Sartomer SR833S/65% Sartomer SR307/2% (on total mixture) IRGACURE 819;

The relatively stretchable regions of the further substrate were formed from a composition comprising 67% Sartomer CN914FF88c polybutadiene-based urethane acrylate/33% isodecylacrylate/2% (on total mixture) IRGACURE 651). The compositions were allowed to mix at their interfaces and cured by light.

It is noted that it is not necessary to combine a further substrate layer having relatively stretchable and non-stretchable regions with a basis substrate layer of shrinkable material.

Figure 6:
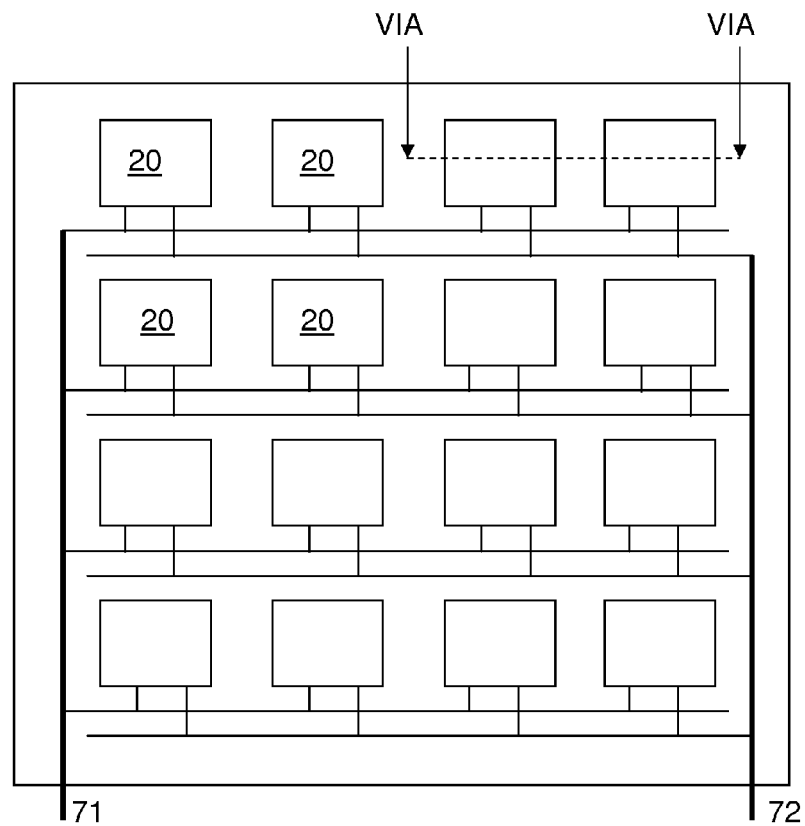
FIG. 6 shows an embodiment of a product according to the fifth aspect of the invention.

In an embodiment a foil-shaped electro-optical product is provided that merely comprises a basis-substrate layer comprising relatively stretchable portions and relatively non-stretchable portions, wherein electro-optic structures are applied in the relatively non-stretchable portions. An example is shown in FIG. 6. The foil-shaped electro-optical product comprises a basis-substrate layer with relatively stretchable portions and relatively non-stretchable portions in which the electro-optical structures are arranged. The electro-optical structures are connected to electrical conductors 71, 72 that extend through the relatively stretchable regions. The electrical conductors 71, 72 may be formed of an electrically conductive stretchable polymer, but may alternatively be formed as a meandering conductor which may be from a relatively stretchable or a relatively non-stretchable material, such as copper or aluminum.

Figure 6A:
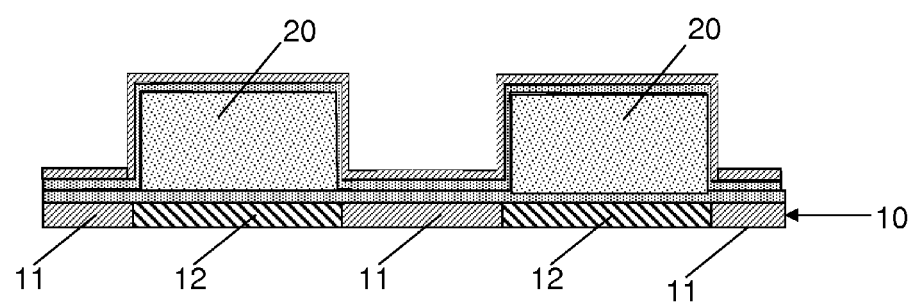
FIG. 6A shows a cross-section according to VIA-VIA in FIG. 6.

FIG. 6A shows a cross-section according to VIA-VIA in FIG. 6. Therein it is shown that the basis-substrate layer 10 is comprises relatively stretchable regions 11 and relatively non-stretchable regions 12. The electro-optical structures 20 are applied with in the relatively non-stretchable regions 12 of the basis-substrate layer 10.

Figure 7:
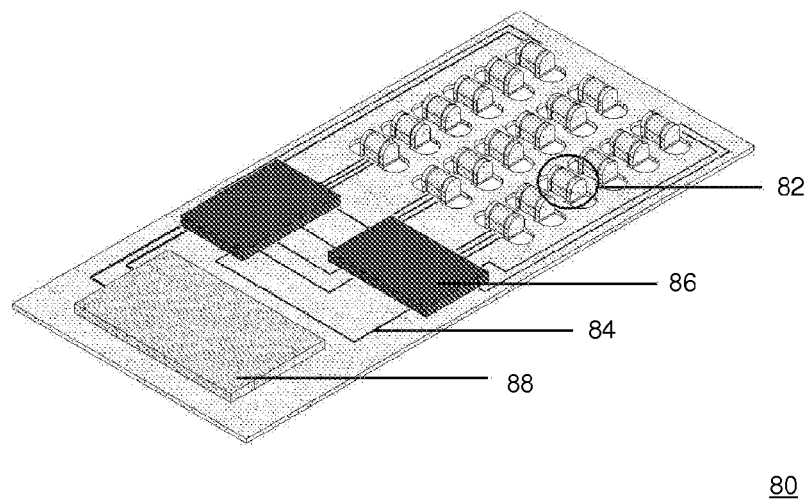
FIG. 7 shows a further embodiment of a product according to the second aspect of the present invention.

FIG. 7 illustrates an optical sensor system according to European patent application of the same applicant (P85977EP00), comprising an array of sensor nodes 82, a printed circuit 84, electronic components 86 and a battery 88.

Figure 8:
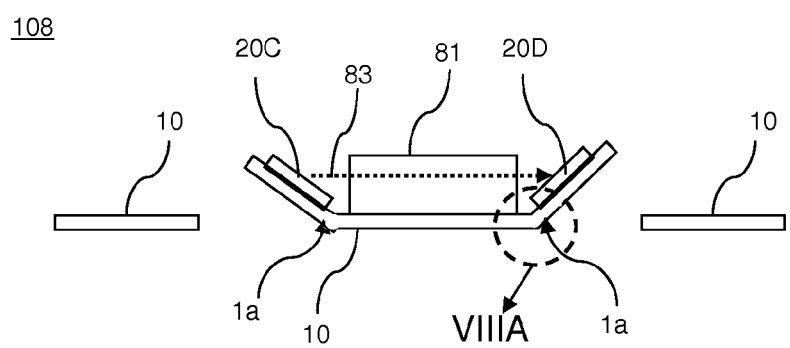
FIG. 8 shows a portion of said product in more detail.

FIG. 8 shows a single sensor node 82 according to an embodiment of the present invention. In the embodiment shown the sensor comprises a light emitting source 20C, a light receiving detector 20D and a light guiding element 81. During operation light 83 emitted by light emitting source 20C is guided via light guiding element 81 to light receiving detector 20D. The light emitting source 20C and the light receiving detector 20D are tilted towards each other by the first regions 1a where the substrate is curved. The light guiding element 81 may be applied with techniques such as, but not limited to printing, embossing or moulding. The light guiding element 81 may be directly printed onto, embossed into or moulded on the basis substrate 10 with optical elements. Alternatively the light guiding element 81 could be fabricated separately using injection moulding or embossing techniques. In this embodiment, the light guiding element 81 is positioned at least partially between the source 20C and the detector 20D. The light guiding element 81 comprises a sensor active material being sensitive to the amount of analyte in a fluid. The term fluid is to be construed as a collective term for gasses and liquids surrounding the sensor 80. Alternatively, the waveguide itself may be composed of the sensor active material.

Figure 8A:
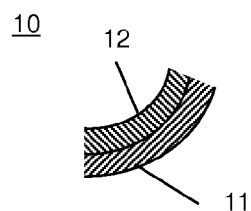
FIG. 8A shows a portion of said product in still more detail,
FIG. 9A to FIG. 9C shows three states of a still further embodiment of a product according to the second aspect of the present invention.

FIG. 8A shows a first region 1a in a portion VIIIA of FIG. 8, which corresponds to a first region in FIG. 8. As shown in FIG. 8A, the basis substrate layer 10 comprises a first sub-layer 11 and a second sub-layer 12. The material of the second sub-layer 12 was obtained from a shrinkable organic substance and was subjected to a treatment that caused this material to shrink, while the material of the first sub-layer 11 was not shrunken during this treatment. This caused the at least a first region shown in FIG. 8A to curve inwards at a side provided with the shrinkable organic substance. The shrinkable organic substance may be a shrinkable polymer, or may be a precursor that shrinks upon curing. The material used for the second sub-layer may be a non-shrinkable polymer, or a precursor thereof that does not shrink upon curing. The shrinkable substance may be applied locally in the regions 1a that are to be curved, or may be applied globally, while locally applying the shrink inducing treatment in the first regions. The shrinkage treatment of the second sub-layer may be applied after placement of the various components and structures at the sensor, so that the sensor may be substantially manufactured in a roll to roll process.

Since the manufacturing method of the sensors may leave the planar substrate 10 largely intact, the sensor array may easily be connected to a conventional (flexible) printed circuit board (F)PCB. Conversely, the substrate 10 itself may be used as an alternative for the printed circuit board. Also moulded interconnect devices (MID) may be used whereby both the optical members and the PCB, are fabricated with the moulding technique.

Figure 9A:
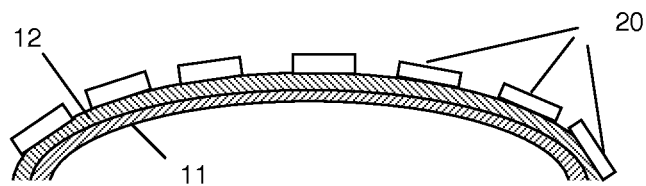
Figure 9B:
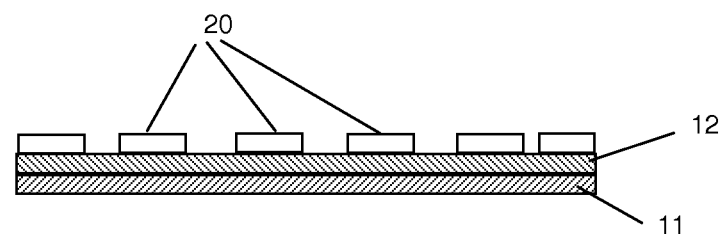
Figure 9C:
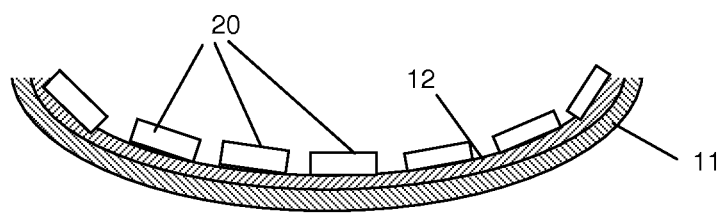

FIGS. 9A, 9B and 9C show a further embodiment of a foil shaped electro-optical product according to the present invention. In the embodiment shown the foil shaped electro-optical product comprises a plurality of electro-optical structures 20 that are arranged at a bi-layer foil that comprises a first layer 11 and a second layer 12. The first layer 11 has a relatively high heat-expansion coefficient as compared to the second layer 12. For this purpose a combination may be used of polymer in a rubber state, which has a relatively high coefficient of expansion and polymer in a glass state, which has a relatively low coefficient of expansion. For example PDMS or polybutadiene, which have a relatively low glass transition temperature Tg, may be used as the polymer having the relatively high heat-expansion coefficient, and polycarbonate or PET, which have a relatively high glass transition temperature Tg, may be used as the polymer having the relatively low heat-expansion coefficient. FIG. 9A shows the product at a relatively low temperature, FIG. 9B shows the product at a higher temperature and FIG. 9C shows the product at a still higher temperature. Accordingly the surface of the bi-layer foil 11,12 that carries the electro-optical structures tends to curve inward at high temperatures. This can be used to advantage in a solar cell arrangement, comprising photo-voltaic cells as the electro-optical structures 20 to reduce the amount of solar radiation captured by the electro-optical structures and therewith counteract a further increase in temperature of the electro-optical structures.

In case the shrinkable organic substance used for the basis substrate is an isotropically shrinking substance, e.g. a substance that shrinks while polymerizing the direction of deformation of the substrate may be controlled by machinery that handles the product. The basis substrate may for example be fixated in a mold to achieve that the product curls up into a predetermined direction. Alternatively the basis substrate may be provided with a reinforcement structure that prevents folding of the basis substrate into an undesired direction. For example in the embodiment of FIG. 4A, 4B the second regions may be comprise a material that is sufficiently rigid to prevent shrinkage of the product in the length direction.

Figure 10:
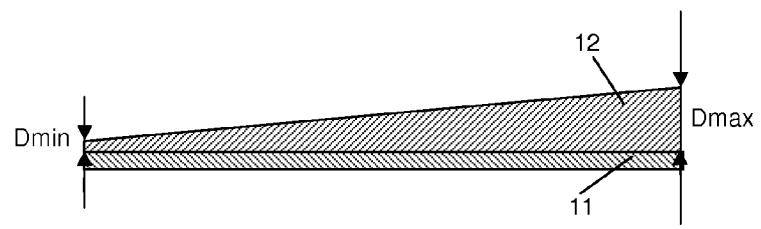
FIG. 10 shows a detail of a product according to the second aspect of the present invention.

In another embodiment the zones 1b may be provided with ribs of a rigid material that extend in the length direction L. In still another embodiment shown in FIG. 10, the basis substrate has a thickness gradient from a minimal value Dmin, e.g. 10 or 20 μm to a maximal value Dmax of 100 to 200 μm.

When manufacturing the curved foil shaped electro-optical product using a heat shrinkage foil for the substrate, care should be taken that the processing of the electro-optical product is carried out at temperatures lower than the minimal shrinkage temperature of the heat shrinkage foil. Furthermore the heat shrinkage foil should be shrinkable at a temperature at which no damage occurs to the other materials forming part of the electro-optical structure.

Alternatively however, a heat shrinkage foil may be applied to the foil shaped electro-optical product in a late stage of the manufacturing process for the curved foil shaped electro-optical product, e.g. as one of the last process steps. In that case a heat shrinkage foil can be applied that has a relatively low shrinkage temperature.

Figure 11:
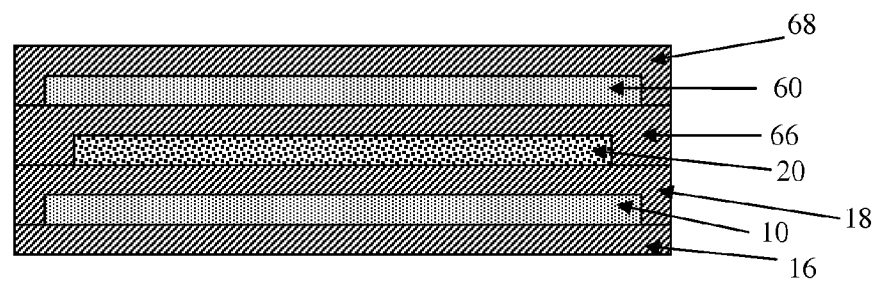
FIG. 11 shows a further embodiment of a semi-finished product according to the third aspect of the invention.

In an embodiment of the electro-optical product the shrinked substance is part of a barrier structure. For example in the embodiment shown in FIG. 11 the electro-optical structure 20 is encapsulated by a first barrier structure 16, 10, 18 and a second barrier structure 66, 60, 68. The first barrier structure comprises a first organic layer 10 between a first and a second inorganic layer 16, 18. The second barrier structure comprises a second organic layer 60 between a first and a second inorganic layer 66, 68. During the manufacturing process the organic layers 10, 60 are subject to a mutually different amount of shrinkage, so that the foil-shaped electro-optical product transforms into a curved foil-shaped electro-optical product.

In the embodiment shown the first organic layer 10 is encapsulated by the first and the second inorganic layer 16, 18. Likewise the second organic layer 60 is encapsulated by the first and the second inorganic layer 66, 68. This prevents a lateral leakage of moisture and oxygen via the organic layers 10, 60. Alternatively the stack 16, 10, 18, 20, 66, 60, 68 may be laterally closed by a sealing construction.

As indicated in this description the present invention is applicable to various types of electro-optical products. The invention is in particular suitable to a light-emitting electro optical products to achieve a desired light distribution. Nevertheless the present invention is also applicable to other types of electro-optical products, e.g. for photo-voltaic cells. The electro-optical structure in a photo-voltaic cells is usually not sensitive to atmospheric components, and hence does not need protection by barrier structures. Also the application may be applied to electro-chrome products, i.e. products having a voltage controlled transmission for photon radiation.

When applying different organic substances in the same layer it is desirable to have an interface. This may be achieved as described for example with reference to FIG. 6A by applying, e.g. by printing the organic substances in mutually adjacent regions and allow the substances to diffuse into each other before curing them.

Figure 12A:
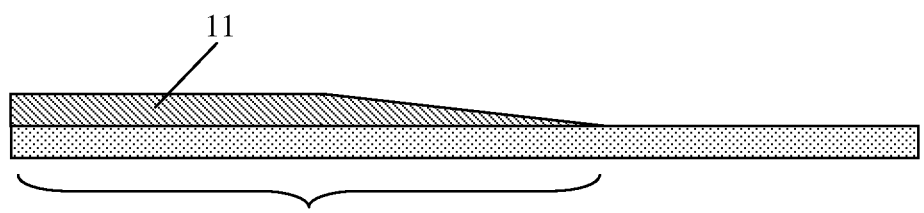
FIG. 12A, 12B shows a first and a second step in a method according to the present invention.
Figure 12B:
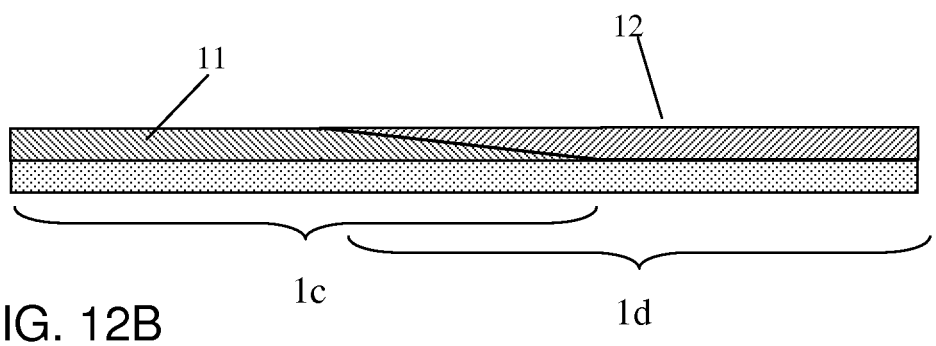

In a further embodiment the organic substances are applied in mutually overlapping regions. For example FIG. 12A shows how a first organic substance 11 is applied in a first region 1c and subsequently a second organic substance 12 is applied in a second region 1d that partially overlaps the first region 1c. In this way a large contact surface is achieved between the applied first and the second organic substances.

In particular, the first and the second organic substance have a mutually complementary thickness coefficient in the region where they overlap. In this way the thickness of the layer jointly formed by the first and the second organic substance is substantially flat.

The invention claimed is:

1. A method of manufacturing a curved foil shaped electro-optical product comprising the steps of:
   providing a basis substrate layer of a shrinkable or expandable organic substance in at least a first region,
   providing at least a further layer in said at least a first region to form a stack with said basis substrate layer,
   providing one or more electro-optical structures at a side of the basis substrate layer of a shrinkable or expandable organic substance, therewith obtaining a semi-finished foil shaped product including the basis substrate layer, the at least a further layer and the one or more electro-optical structures and subsequently applying to said shrinkable or expandable substance of said basis substrate layer of said semi-finished foil shaped product:
   either a treatment that causes the organic substance to shrink, therewith causing the stack to curve inwards at a side provided with the shrinkable organic substance, or
   a treatment that causes the organic substance to expand, therewith causing the stack to curve outwards at a side provided with the shrinkable organic substance, wherein the shrinkable or expandable organic substance is a precursor for a polymer and wherein the treatment that causes the organic substance to shrink or to expand comprises the step of polymerizing or converting the organic substance.

2. A method according to claim 1, wherein the organic substance comprises a system that is curable by radical addition polymerization.

3. A method according to claim 1, wherein the organic substance comprises a system that reacts via addition reactions that do not lead to ring opening.

4. A method according to claim 1, wherein the organic substance comprises a small ring system that is curable by ring opening.

5. A method according to claim 1, wherein the organic substance comprises a large ring system that is curable by ring opening.

6. A method according to claim 1, wherein the organic substance comprises a ring system that is curable by double ring opening.

7. A curved foil shaped electro-optical product comprising an electro-optical structure obtainable by the steps of
   providing a basis substrate layer of a shrinkable or expandable organic substance in at least a first region,
   providing at least a further layer in said at least a first region to form a stack with said basis substrate layer, and
   providing one or more electro-optical structures at a side of the basis substrate layer of the shrinkable or expandable organic substance, therewith obtaining a semi-finished foil shaped product including the basis substrate layer, the at least a further layer and the one or more electro-optical structures and subsequently applying to said shrinkable or expandable organic substance of said basis substrate layer of said semi-finished foil shaped product either:
   a treatment that causes the organic substance to shrink, therewith causing the stack to curve inwards at a side provided with the shrinkable organic substance, or
   a treatment that causes the organic substance to expand, therewith causing the stack to curve outwards at a side provided with the expandable organic substance, the semi-finished foil shaped product comprising a plurality of zones, each zone having at least one of the one or more electro-optical structures that are encapsulated by a first and a second barrier layer.

8. A curved foil shaped electro-optical product comprising an electro-optical structure obtainable by the steps of
   providing a basis substrate layer of a shrinkable or expandable organic substance in at least a first region,
   providing at least a further layer in said at least a first region to form a stack with said basis substrate layer, and
   providing one or more electro-optical structures at a side of the basis substrate layer of the shrinkable or expandable organic substance, therewith obtaining a semi-finished foil shaped product including the basis substrate layer, the at least a further layer and the one or more electro-optical structures and subsequently applying to said shrinkable or expandable organic substance of said basis substrate layer of said semi-finished foil shaped product either:
   a treatment that causes the organic substance to shrink, therewith causing the stack to curve inwards at a side provided with the shrinkable organic substance, or
   a treatment that causes the organic substance to expand, therewith causing the stack to curve outwards at a side provided with the expandable organic substance, wherein the at least a first curved region is arranged between mutually separate second regions each comprising at least one of the one or more electro-optical structures.

9. A curved foil-shaped electro-optical product according to claim 8, wherein the mutually separate second regions are electrically coupled via stretchable electrical connection lines.

10. A curved foil-shaped electro-optical product according to claim 9, wherein the stretchable electrical connection lines are meandering electrical connection lines.

11. A curved foil shaped electro-optical product comprising an electro-optical structure obtainable by the steps of
   providing a basis substrate layer of a shrinkable or expandable organic substance in at least a first region,
   providing at least a further layer in said at least a first region to form a stack with said basis substrate layer, and
   providing one or more electro-optical structures at a side of the basis substrate layer of the shrinkable or expandable organic substance, therewith obtaining a semi-finished foil shaped product including the basis substrate layer, the at least a further layer and the one or more electro-optical structures and subsequently applying to said shrinkable or expandable organic substance of said basis substrate layer of said semi-finished foil shaped product either:
   a treatment that causes the organic substance to shrink, therewith causing the stack to curve inwards at a side provided with the shrinkable organic substance, or
   a treatment that causes the organic substance to expand, therewith causing the stack to curve outwards at a side provided with the expandable organic substance, wherein the electro-optic structure is applied at the convex side of the shrunken or expanded organic substance.

12. A curved foil shaped electro-optical product comprising an electro-optical structure obtainable by the steps of
   providing a basis substrate layer of a shrinkable or expandable organic substance in at least a first region, providing at least a further layer in said at least a first region to form a stack with said basis substrate layer, and providing one or more electro-optical structures at a side of the basis substrate layer of the shrinkable or expandable organic substance, therewith obtaining a semi-finished foil shaped product including the basis substrate layer, the at least a further layer and the one or more electro-optical structures and subsequently applying to said shrinkable or expandable organic substance of said basis substrate layer of said semi-finished foil shaped product either:

a treatment that causes the organic substance to shrink, therewith causing the stack to curve inwards at a side provided with the shrinkable organic substance, or a treatment that causes the organic substance to expand, therewith causing the stack to curve outwards at a side provided with the expandable organic substance, wherein the further layer is a further substrate layer that is arranged opposite the basis substrate layer and that is subject to a different amount of shrink or expansion than the basis substrate layer.

13. A curved foil-shaped electro-optical product according to claim 12, wherein the electro-optical structure is arranged in a second region that at least partly coincides with the at least a first region, and wherein the electro-optical structure is arranged between the basis substrate layer and the further substrate layer.

14. A curved foil shaped electro-optical product comprising an electro-optical structure obtainable by the steps of providing a basis substrate layer of a shrinkable or expandable organic substance in at least a first region, providing at least a further layer in said at least a first region to form a stack with said basis substrate layer, and providing one or more electro-optical structures at a side of the basis substrate layer of the shrinkable or expandable organic substance, therewith obtaining a semi-finished foil shaped product including the basis substrate layer, the at least a further layer and the one or more electro-optical structures and subsequently applying to said shrinkable or expandable organic substance of said basis substrate layer of said semi-finished foil shaped product either:

a treatment that causes the organic substance to shrink, therewith causing the stack to curve inwards at a side provided with the shrinkable organic substance, or a treatment that causes the organic substance to expand, therewith causing the stack to curve outwards at a side provided with the expandable organic substance, wherein the organic substance used for the basis substrate layer is a reversibly shrinkable material.

15. A foil-shaped electro-optical product according to claim 14, wherein the reversible shrinkage is determined by a temperature of the substance.

16. A foil-shaped electro-optical product according to claim 15, wherein the temperature of the reversible shrinkable optical substance is controlled by resistive elements.

* * * * *